US010395935B2

(12) United States Patent
Ishiguro et al.

(10) Patent No.: US 10,395,935 B2
(45) Date of Patent: Aug. 27, 2019

(54) PLASMA PROCESSING APPARATUS AND PLASMA PROCESSING METHOD

(71) Applicant: Hitachi High-Technologies Corporation, Tokyo (JP)

(72) Inventors: Masaki Ishiguro, Tokyo (JP); Masahiro Sumiya, Tokyo (JP); Shigeru Shirayone, Tokyo (JP); Kazuyuki Ikenaga, Tokyo (JP); Tomoyuki Tamura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/904,856

(22) Filed: Feb. 26, 2018

(65) Prior Publication Data
US 2018/0190502 A1 Jul. 5, 2018

Related U.S. Application Data

(62) Division of application No. 15/057,162, filed on Mar. 1, 2016, now Pat. No. 9,941,133.

(30) Foreign Application Priority Data

May 12, 2015 (JP) ................................. 2015-096998

(51) Int. Cl.
*H01L 21/3065* (2006.01)
*H01L 21/683* (2006.01)
*H01J 37/32* (2006.01)

(52) U.S. Cl.
CPC .... *H01L 21/3065* (2013.01); *H01J 37/32422* (2013.01); *H01J 37/32577* (2013.01);
(Continued)

(58) Field of Classification Search
USPC ........................................................ 216/67
See application file for complete search history.

(56) References Cited

U.S. PATENT DOCUMENTS

| 5,894,400 A | 4/1999 | Graven |
| 6,346,428 B1 | 2/2002 | Athavale |
| (Continued) | | |

FOREIGN PATENT DOCUMENTS

| JP | 7-22499 A | 1/1995 |
| JP | 2004-047511 A | 2/2004 |
| (Continued) | | |

OTHER PUBLICATIONS

Japanese Office Action received in corresponding Japanese Application No. 2015-096998 dated Sep. 18, 2018.
(Continued)

*Primary Examiner* — Roberts P Culbert
(74) *Attorney, Agent, or Firm* — Mattingly & Malur, PC

(57) ABSTRACT

A plasma processing apparatus includes a plasma processing chamber processing a sample using plasma, a radio frequency power supply supplying radio frequency power for generating the plasma, a sample stage including an electrode electrostatically chucking the sample, mounting the sample thereon, a DC power supply applying DC voltage to the electrode, and a control device shifting the DC voltage previously set, in a negative direction by a first shift amount during discharge of the plasma, shifting the DC voltage having been shifted in the negative direction by the first shift amount, in a positive direction by a second shift amount after the discharge of the plasma. The first shift amount has a value changing potential over a surface of the sample to 0 V, upon shifting the DC voltage in the positive direction. The second shift amount has a value obtained based on a floating potential of the plasma.

3 Claims, 15 Drawing Sheets

(52) U.S. Cl.
CPC .. *H01J 37/32706* (2013.01); *H01J 37/32917* (2013.01); *H01J 37/32972* (2013.01); *H01L 21/6831* (2013.01)

(56) References Cited

U.S. PATENT DOCUMENTS

| | | |
|---|---|---|
| 2007/0211402 A1 | 9/2007 | Sawataishi et al. |
| 2009/0097185 A1 | 4/2009 | Shannon |
| 2009/0109595 A1 | 4/2009 | Herchen |
| 2014/0090597 A1 | 4/2014 | Hirasawa |

FOREIGN PATENT DOCUMENTS

| | | |
|---|---|---|
| JP | 2010-040822 A | 2/2010 |
| JP | 5596082 B2 | 9/2014 |
| JP | 2015-72825 A | 4/2015 |
| TW | 200913124 | 3/2009 |
| WO | 2009/013803 A1 | 1/2009 |

OTHER PUBLICATIONS

Korean Office Action received in corresponding Korean Application No. 10-2016-0008548 dated Dec. 13, 2016.
Machine Translation TW200913124, Hasegawa, Mar. 2009.

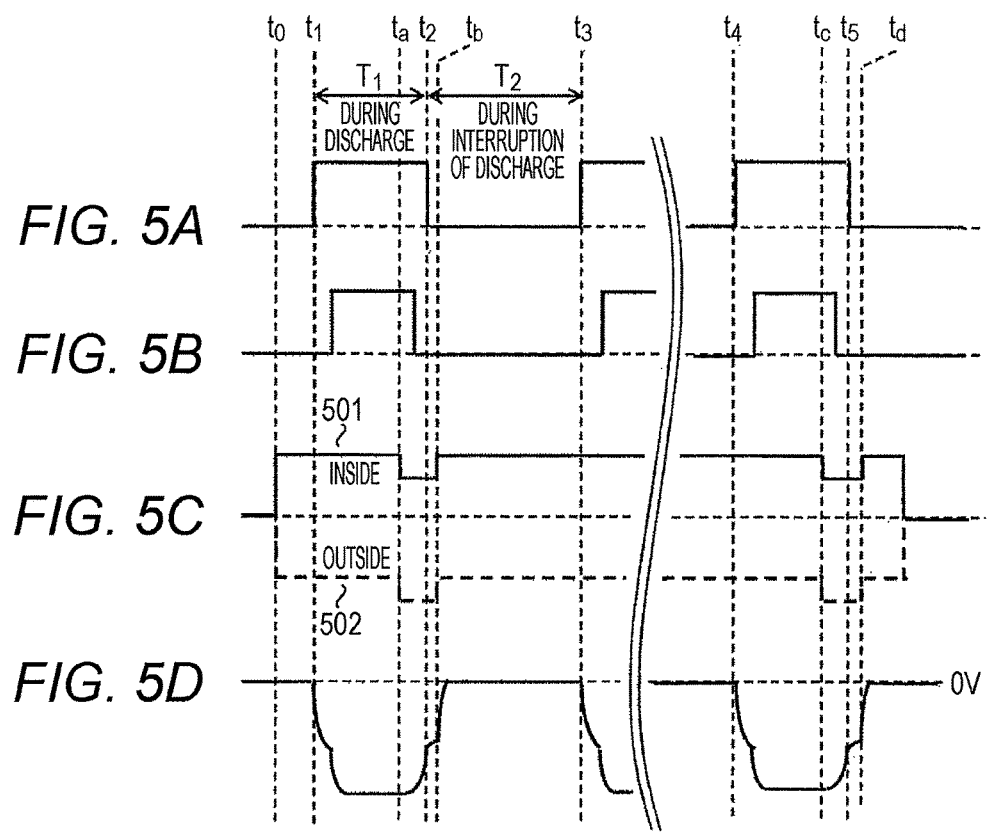

PLASMA PROCESSING APPARATUS AND PLASMA PROCESSING METHOD

BACKGROUND OF THE INVENTION

1. Field of the Invention

The present invention relates to a technique for manufacturing a semiconductor device. More particularly, the present invention relates to a plasma processing apparatus and a plasma processing method suitable for manufacturing a semiconductor device.

2. Description of the Related Art

A plasma processing method for semiconductor manufacturing includes plasma etching. In the plasma etching, a sample substrate (wafer) is mounted on a sample stage in a processing chamber, and exposed to plasma. At this time, various processing conditions, such as gas species introduced into the processing chamber and radio frequency power applied to the wafer, are adjusted to selectively remove a specific layered film on the wafer and form a fine circuit pattern on the wafer.

For processing different films, any of processing conditions needs to be changed according to a film to be processed. Since the plasma processing is desirably performed in a stable plasma state, the processing conditions are normally changed during interruption of plasma discharge. Thus, plasma discharge and interruption of the discharge is generally repeated, in the plasma etching.

In a plasma etching as described above, for fulfilling a request for prevention of displacement of the wafer during processing, wafer temperature control, or the like, the wafer is normally secured on a sample stage using an electrostatic chuck electrode or the like. When the wafer is secured on the sample stage using the electrostatic chuck electrode, potential may be generated on a surface of the wafer according to a potential of the electrostatic chuck electrode. The potential generated on the surface of the wafer may cause discharge in a vacuum to bring about breakage of a device or wiring on the wafer. Thus, the potential over the surface of the wafer is desirably suppressed. A method of suppressing the potential over the surface of the wafer during chucking the wafer onto the sample stage using the electrostatic chuck electrode includes the following.

WO 2009/013803 says that, in a bipolar chuck electrode, when electrode portions have asymmetric areas or when distances between the electrode portions and a wafer are different although pattern rules including the area and the width are identical between both electrode portions, application of a voltage of the same absolute value to both electrode portions tends to deviates a potential over a wafer chuck surface to a potential of an electrode having a large area or a potential of a first electrode layer near a surface layer. For this reason, WO 2009/013803 discloses a technique in which a set of voltages having different polarities is applied to a first electrode portion and a second electrode portion to reduce the potential over the wafer chuck surface on which the wafer is electrostatically chucked, for cancellation of imbalance in surface potential caused by the asymmetric areas of both electrode portions.

SUMMARY OF THE INVENTION

In WO 2009/013803, potential generated on the surface of the wafer caused by influx of charged particles from the plasma during the plasma processing is not taken into consideration. In the plasma etching, a back surface of the wafer to be processed has a high resistance film, and the wafer may be often considered to be substantially insulated from other structures. Further, in some cases, a sintered dielectric film having a resistivity of approximately $10^{15}$ Ωcm is used as a dielectric film over the electrostatic chuck electrodes, and the wafer can be also considered to be insulated from other structures.

As described above, when the wafer is insulated, charged particles from the plasma is prevented from being moved from the wafer, and floating potential of the plasma may remain on the surface of the wafer, even after extinction of the plasma. As described above, the plasma discharge and the interruption of the discharge are repeated in the plasma etching, and when potential is generated on the surface of the wafer upon extinction of the plasma, the potential is held while the plasma discharge is interrupted and the processing conditions are changed.

When potential is generated on the surface of the wafer during interruption of the plasma discharge, as described above, dust particles electrically charged in a vacuum processing chamber adhere onto the wafer due to the potential and cause a reduction in yield.

The present invention relates to the plasma processing, and provides a plasma processing apparatus and a plasma processing method which can cancel potential over a surface of a wafer generated by plasma during interruption of the plasma discharge, and can reduce adhesion of dust particles electrically charged, onto the wafer.

The present invention provides a plasma processing apparatus including a plasma processing chamber configured to process a sample using plasma, a radio frequency power supply configured to supply radio frequency power for generation of the plasma, a sample stage including an electrode configured to electrostatically chuck the sample, the sample stage configured to mount the sample thereon, a DC power supply configured to apply DC voltage to the electrode, and a control device configured to shift the DC voltage previously set, in a negative direction by a first shift amount during discharge of the plasma, and shift the DC voltage having been shifted in the negative direction by the first shift amount, in a positive direction by a second shift amount after the discharge of the plasma. The first shift amount has a value changing potential over a surface of the sample to 0 V, upon shifting the DC voltage in the positive direction, and the second shift amount has a value obtained based on floating potential of the plasma.

Further, the present invention provides a plasma processing method using a plasma processing apparatus including a plasma processing chamber configured to process a sample using plasma, a radio frequency power supply configured to supply radio frequency power for generation of the plasma, a sample stage including an electrode configured to electrostatically chuck the sample, the sample stage configured to mount the sample thereon, and a DC power supply configured to apply DC voltage to the electrode. The plasma processing method includes shifting the DC voltage previously set, in a negative direction by a first shift amount during discharge of the plasma, and shifting the DC voltage having been shifted in the negative direction by the first shift amount, in a positive direction by a second shift amount after the discharge of the plasma. The first shift amount has a value changing potential over a surface of the sample to 0 V, upon shifting the DC voltage in the positive direction, and the second shift amount has a value obtained based on a floating potential of the plasma.

According to a representative embodiment of the present invention, the potential over the surface of the wafer generated by the plasma can be cancelled during interruption of the plasma discharge, and adhesion of dust particles electrically charged onto the wafer can be reduced, in the plasma processing.

BRIEF DESCRIPTION OF THE DRAWINGS

FIGS. 5A to 5D are time charts of processing according to the first example;

DESCRIPTION OF THE PREFERRED EMBODIMENTS

First to third examples of the present invention will be described below in sequence.

First Example

Figure 1:
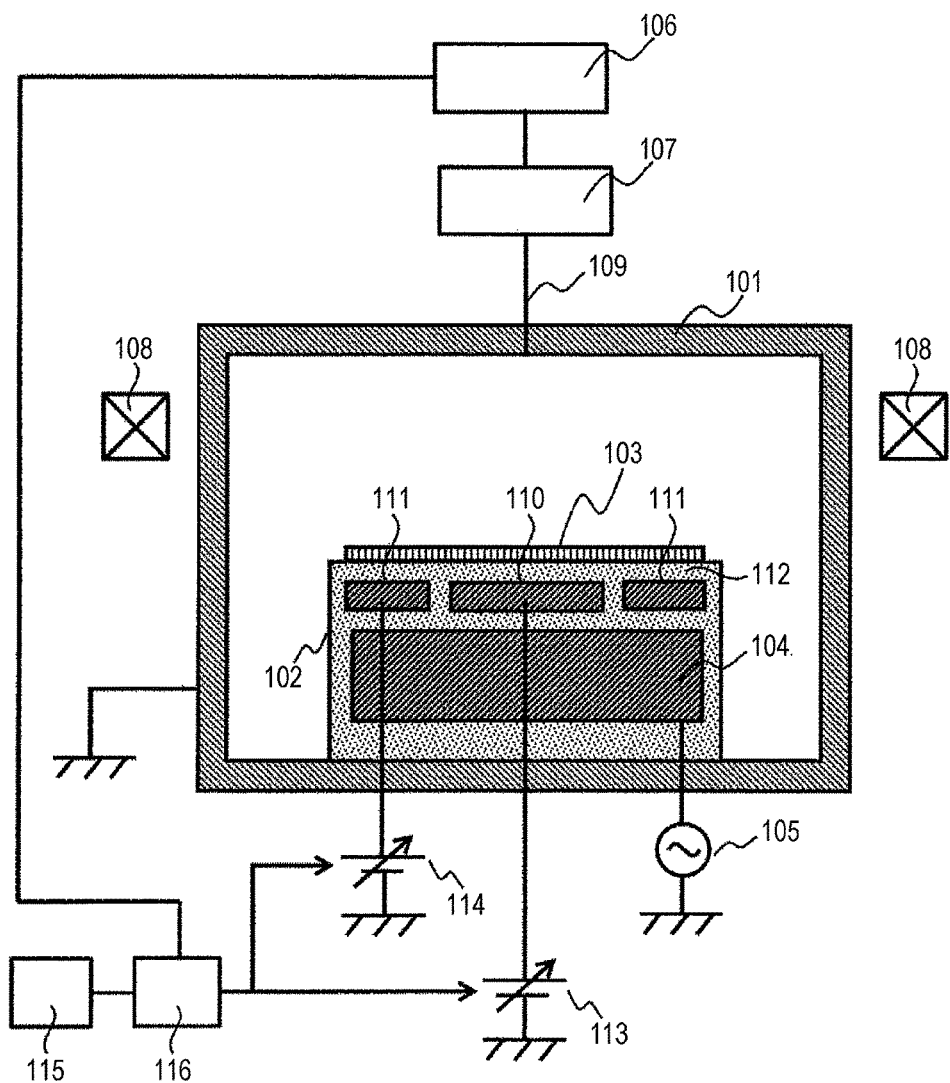
FIG. 1 is a diagram illustrating a cross-sectional configuration of a main portion of a plasma processing apparatus according to a first example.

A plasma processing apparatus according to a first embodiment of the present invention will be described using FIGS. 1 to 12. FIG. 1 is a diagram illustrating a cross-sectional configuration of a main portion of a plasma processing apparatus according to a first embodiment. The plasma processing apparatus according to the first embodiment of FIG. 1 is an electron cyclotron resonance (ECR) etching apparatus. Hereinafter, the electron cyclotron resonance is referred to as ECR.

The plasma processing apparatus of FIG. 1 being the ECR etching apparatus, is configured so that a wafer 103 being a semiconductor substrate as a sample is mounted on a sample stage 102 being a sample mounting stage in a processing chamber 101 being a vacuum processing chamber, and plasma is generated in the processing chamber 101. After generation of the plasma, the plasma processing apparatus supplies power from a radio frequency power supply 105 to a radio frequency electrode 104 installed in the sample stage 102. Supply of the power generates a negative potential called self-bias on a surface of the wafer 103. This negative potential draws ions to the wafer 103 to cause so-called reactive ion etching, and etching proceeds.

The processing chamber 101 has an inner wall, and the inner wall has a substrate including a grounded conductor. In the present example, the substrate of the inner wall including the grounded conductor may be exposed to the plasma. Further, the substrate of the inner wall including the conductor may have a dielectric film, the dielectric film having a thin thickness so that a potential is immediately changed to 0 V on a surface of the inner wall, after extinction of the plasma.

The plasma processing apparatus includes a microwave power supply 106, a microwave oscillation source 107, and a solenoid coil 108, as a mechanism for generating the plasma. Radio frequency power from the microwave power supply 106 generates microwave at the microwave oscillation source 107, and the microwave is introduced into the processing chamber 101 through a waveguide 109. The microwave imparts energy to electrons using ECR in a magnetic field generated by the solenoid coil 108. The electrons ionize a gas supplied from a gas supply source not illustrated to generate the plasma.

During the plasma processing, a coolant gas for control of a temperature of the wafer 103 is supplied on a back surface of the wafer 103. In order to prevent displacement of the wafer 103 caused by the coolant gas, the wafer 103 is chucked on the sample stage 102 by bipolar electrostatic chuck electrodes 110 and 111 being electrodes having different polarities. The electrostatic chuck electrodes 110 and 111 are concentrically disposed, an electrostatic chuck electrode 110 as one electrode being disposed on an inside, an electrostatic chuck electrode 111 as the other electrode being disposed on an outside.

A dielectric layer 112 is positioned between the electrostatic chuck electrodes 110 and 111 and the wafer 103. The electrostatic chuck electrodes 110 and 111 and the wafer 103 are electrically connected to have finite resistance value and electrostatic capacitance. Variable DC power supplies 113 and 114 are connected to the electrostatic chuck electrodes 110 and 111 being an independent power supply, respectively. One variable DC power supply 113 is connected to the electrostatic chuck electrode 110 on the inside, and the other variable DC power supply 114 is connected to the electrostatic chuck electrode 111 on the outside.

Potentials having opposite polarities are applied to the electrostatic chuck electrodes 110 and 111 from respective power supplies. For example, a potential of +500 V is applied to the electrostatic chuck electrode 110 on the inside by the variable DC power supply 113, and a potential of −500 V is applied to the electrostatic chuck electrode 111 on the outside by the variable DC power supply 114. In addition, the plasma processing apparatus according to the present example includes a control device 116 and a storage device 115 which are used for control of output voltage values of the variable DC power supplies 113 and 114. The variable DC power supplies 113 and 114 are connected to the control device 116, and the output voltage values of the variable DC power supplies 113 and 114 are controlled from the control device 116.

Figure 2:
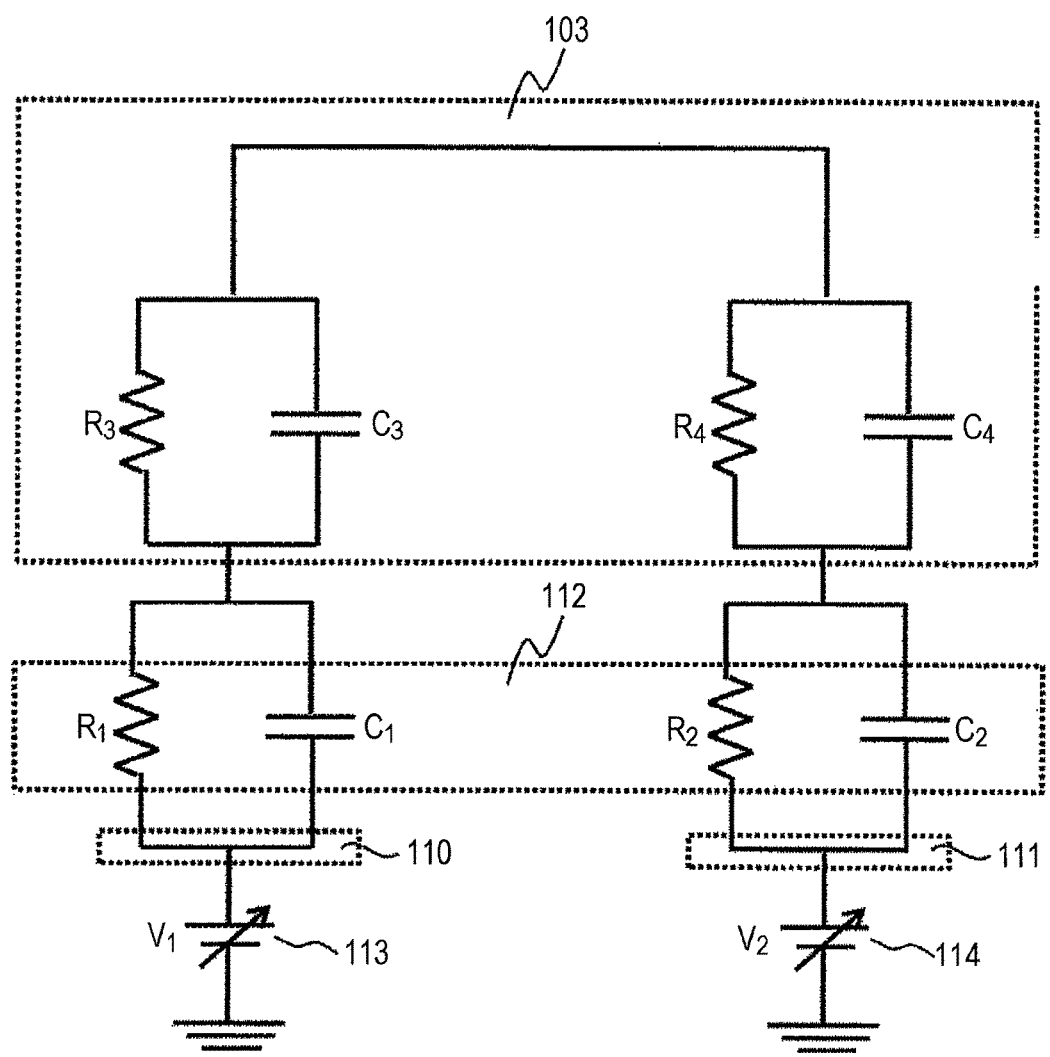
FIG. 2 is a diagram illustrating an equivalent circuit model of a variable DC power supply, an electrostatic chuck electrode, a dielectric layer, and a wafer.

First, potential over the surface of the wafer will be described which is generated with chucking of the wafer by the electrostatic chuck electrodes. FIG. 2 illustrates a simple equivalent circuit model of the variable DC power supplies 113 and 114, the electrostatic chuck electrodes 110 and 111, the dielectric layer 112, and the wafer 103, in the plasma processing apparatus according to the first embodiment. Note that, in the equivalent circuit, a film on the back surface of the wafer 103 has a measurable resistance value, and the wafer substrate has a negligibly small resistance.

In the equivalent circuit of FIG. 2, $V_1$ is a voltage of the variable DC power supply 113, and $V_2$ is a voltage of the variable DC power supply 114. $R_1$ and $R_2$ are resistances of the dielectric layer 112, and $C_1$ and $C_2$ are capacitances of the dielectric layer 112. $R_3$ and $R_4$ are resistances of the film on the back surface of the wafer 103, and $C_3$ and $C_4$ are capacitances of the film on the back surface of the wafer 103. $R_1$, $C_1$, $R_3$, and $C_3$ are a resistance and a capacitance of inside electrical circuit including inner electrostatic chuck electrode 110, and $R_2$, $C_2$, $R_4$, and $C_4$ are a resistance and a capacitance of outside electrical circuit including outer electrostatic chuck electrode 111.

A potential $V_{waf}$ on the surface of the wafer 103 during a normal state is expressed by formula 1. In the normal state, plasma discharge is not performed. In formula 1, $R_{in}$ is a combined resistance value of $R_1$ and $R_3$, and $R_{out}$ is a combined resistance value of $R_2$ and $R_4$. $V_1$, and $V_2$ are the output voltages of the variable DC power supplies 113 and 114, respectively.

[Math 1]

$$V_{waf} = \frac{R_{in} V_2 + R_{out} V_1}{R_{in} + R_{out}} \quad \text{formula 1}$$

$V_{waf}$ is a function of $V_1$ and $V_2$, and obviously, an output voltage of a variable DC power supply can be changed to change the potential of the wafer. Further, when $R_{in}=R_{out}$ in formula 1, the potential over the surface of the wafer 103 has an average value of $V_1$ and $V_2$ being the output voltages of the variable DC power supplies 113 and 114 being both power sources. When the potential over the surface of the wafer 103 is 0 V, an output voltage ratio between the variable DC power supply 113 and the variable DC power supply 114 is expressed by the following formula 2, based on formula 1.

[Math 2]

$$\frac{V_2}{V_1} = -\frac{R_{out}}{R_{in}} \quad \text{formula 2}$$

Accordingly, when $R_{in}=R_{out}$, the output voltages of both variable DC power supplies have an equal absolute value, and when the output voltages have opposite polarities, the wafer has a potential of 0 V. Further, in the limits, $R_{in}, R_{out} \to \infty$, the potential over the surface of the wafer is expressed by the following formula 3. In formula 3, $C_{in}$ is a combined resistance value of $C_1$ and $C_3$, and $C_{out}$ is a combined resistance value of $C_2$ and $C_4$.

[Math 3]

$$V_{waf} = \frac{C_{in} V_1 + C_{out} V_2}{C_{in} + C_{out}} \quad \text{formula 3}$$

In formula 3, when $C_{in}=C_{out}$, the potential over the surface of the wafer 103 has the average value of the output voltages of both power supplies. Further, when the potential over the surface of the wafer 103 is 0 V, the output voltage ratio between the variable DC power supply 113 and the variable DC power supply 114 is expressed by the following formula 4, based on formula 3.

[Math 4]

$$\frac{V_2}{V_1} = -\frac{C_{in}}{C_{out}} \quad \text{formula 4}$$

Accordingly, in the limits, $R_{in}, R_{out} \to \infty$, when $C_{in}=C_{out}$, the output voltages of both variable DC power supplies have an equal absolute value, and when the output voltages have opposite polarities, the wafer has a potential of 0 V. In the equivalent circuit illustrated in FIG. 2, first, potential of the electrostatic capacitance determined by formula 3 is generated on the surface of the wafer, at the moment of starting chucking, and then the potential over the surface of the wafer is shifted to the potential of the resistances expressed by formula 1, according to a time constant of the circuit. In the present example, $R_{in}=R_{out}$ and $C_{in}=C_{out}$.

FIGS. 3A to 3D are time charts illustrating states of processing including plasma processing in a conventional plasma processing apparatus. This plasma processing apparatus in a conventional mode has the processing chamber 101 of a configuration similar to FIG. 1, but the plasma processing apparatus is not configured to control the output voltages of the variable DC power supplies 113 and 114 to the electrostatic chuck electrodes 110 and 111 by the control device 116 according to the first embodiment.

FIG. 3A illustrates microwave incident power which is radio frequency power from the microwave power supply 106. FIG. 3B illustrates incident power of radio frequency bias which is radio frequency power supplied from the radio frequency power supply 105 to the radio frequency electrode 104. FIG. 3C illustrates output voltages of the variable DC power supplies.

Further, a solid line 301 represents the output voltage of the variable DC power supply 113 to the electrostatic chuck electrode 110 on the inside, and a broken line 302 represents the output voltage of the variable DC power supply 114 to the electrostatic chuck electrode 111 on the outside. In the conventional mode, the output voltages are not variably controlled but constant. FIG. 3D illustrates the potential over the surface of the wafer. A time period $T_1$ from time $t_1$ to time $t_2$ represents a time in which the plasma discharge is performed. A time period $T_2$ from time $t_2$ to time $t_3$ represents a time in which the plasma discharge is interrupted.

Figure 3:
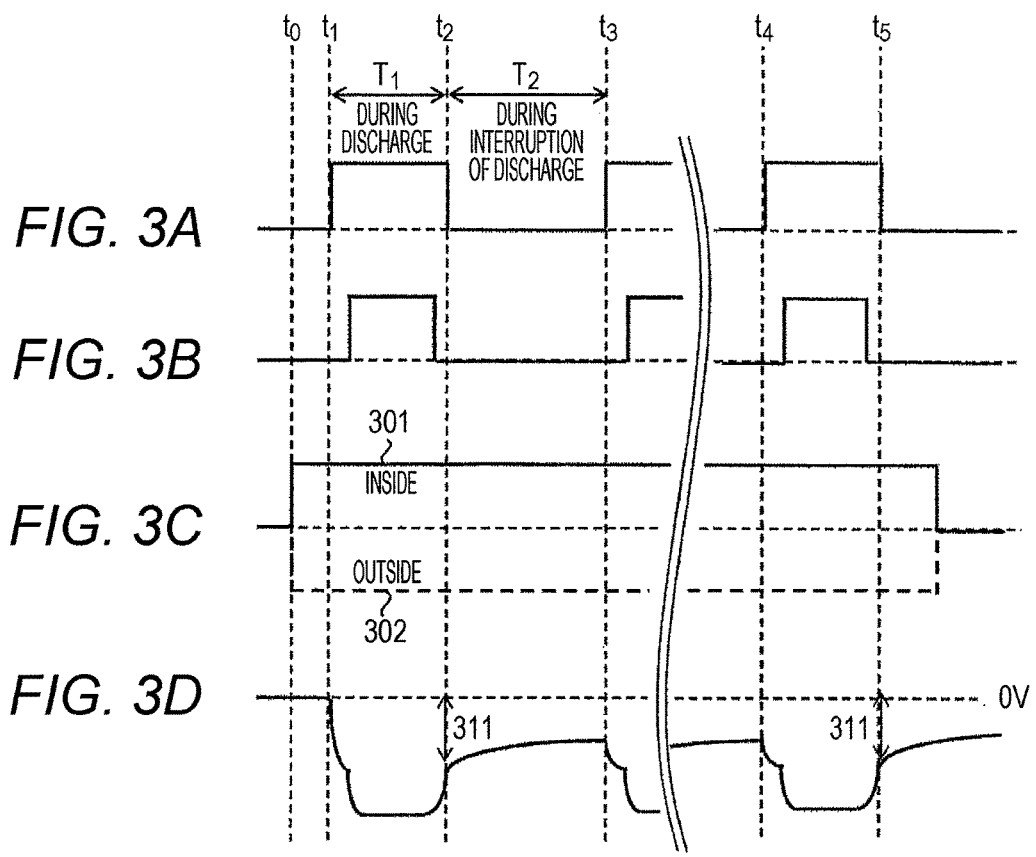
FIGS. 3A to 3D are time charts of processing in a conventional plasma processing apparatus.

In the processing in the conventional mode of FIG. 3, at time $t_2$ or time $t_5$ immediately after the discharge, the surface of the wafer has a potential obtained by influx of charged particles from the plasma, that is, a potential equal to a floating potential of the plasma, as indicated by 311. The potential is held while changing its value during the time period $T_2$ in which the discharge is interrupted. Such potential causes attraction of dust particles to the wafer.

Figure 4:
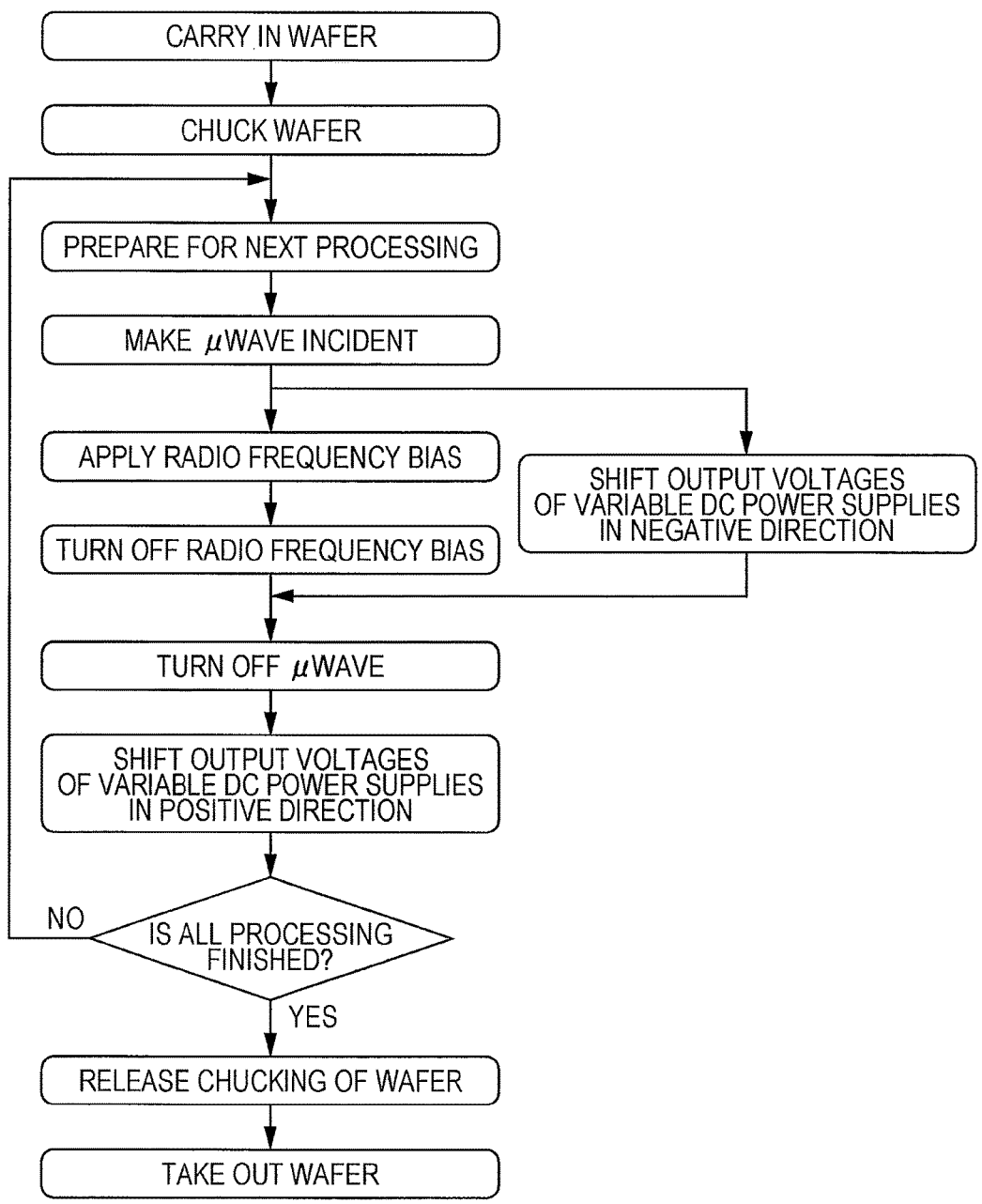
FIG. 4 is a flowchart illustrating control according to an example of the present invention.

FIG. 4 is a flowchart of processing including plasma processing in the plasma processing apparatus according to the present example, and FIGS. 5A to 5D are time charts illustrating states of the processing. FIGS. 5A and 5B are similar to FIGS. 3A and 3B. FIG. 5C illustrates the output voltages of the variable DC power supplies. A solid line 501 represents the output voltage of the variable DC power supply 113 to the electrostatic chuck electrode 110 on the inside, and a broken line 502 represents the output voltage of the variable DC power supply 114 to the electrostatic chuck electrode 111 on the outside. In the present example, the output voltage is variably controlled. FIG. 5D illustrates the potential over the surface of the wafer. Further, FIGS. 6A to 6E are schematic diagrams illustrating potential of the wafer which is changed as the processing progresses. The processing in the plasma processing apparatus according to the present example will be described below using FIGS. 4, 5A to 5D, and 6A to 6E.

In the plasma processing apparatus according to the present example, as illustrated in FIG. 4, the wafer 103 is carried into the processing chamber 101 first to be mounted on the sample stage 102, and then, based on control from the control device 116, the variable DC power supply 113 and the variable DC power supply 114 output voltages for chucking the wafer 103 so that the wafer is chucked on the sample stage. At this time, the output voltages have the same absolute value and different polarities between both variable DC power supplies, so that formula 2 and formula 4 are satisfied simultaneously, and generation of the potential of the wafer can be inhibited. Then, the plasma processing apparatus prepares for processing such as regulation of pressure in the processing chamber 101.

After the preparation, microwave power is applied for generation of the plasma. Thus, after the plasma is generated, radio frequency bias is applied, and the etching is performed. After the etching is desirably finished, the incident power of the radio frequency bias is turned off, and then, the microwave power is turned off. Further, the output voltages of the variable DC power supplies are shifted by an amount of floating potential of the plasma in a negative direction by the control device 116, at suitable time from start to turning off of incidence of the microwave.

Next, after turning off of the microwave power, the output voltages of the variable DC power supplies are shifted by the control device 116, in a positive direction by the amount of floating potential of the plasma. Then, when all of the processing is not finished, preparation for next processing is started. When all of the processing is finished, the chucking of the wafer is released, and the wafer is taken out of the processing chamber.

Figure 6A:
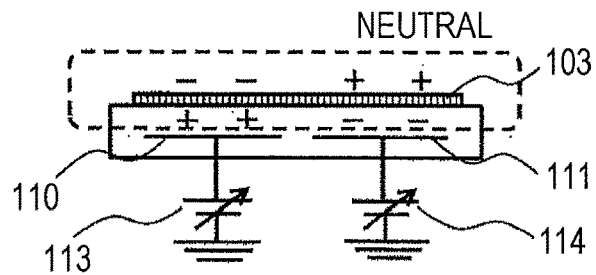
FIGS. 6A to 6E are schematic diagrams illustrating changing states of potential of a wafer according to the first example.
Figure 6B:
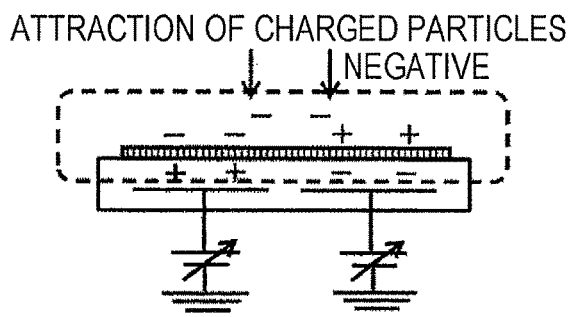

As illustrated in FIG. 5D, in the potential over the surface of the wafer during the processing, the wafer is chucked on the sample stage by the electrostatic chuck electrode at time $t_0$, but the output voltages of the variable DC power supplies satisfy formula 2 and formula 4, so that the potential is not generated on the surface of the wafer. FIG. 6A illustrates a schematic diagram. Here, the potential over the surface of the wafer corresponds to the total charge of a part enclosed by a broken line in FIGS. 6A to 6E. Then, in FIGS. 5A to 5D, the plasma is generated at time $t_1$ by incidence of the microwave, and the influx of the charged particles from the plasma is caused on the surface of the wafer. As illustrated in FIG. 6B, a larger amount of electrons flow into the wafer, and a negative potential called floating potential is generated on the wafer.

Then, the radio frequency bias is applied to the surface of the wafer, and further, a larger negative potential is generated on the surface of the wafer. At time $t_a$ during discharge, output voltages of the variable DC power supplies are shifted in a negative direction, but wafer surface potential is not changed. When the plasma is generated where $R_{in}$ and $R_{out}$ of formula 1 are sufficiently large, the influx of the electrical charges is caused from the plasma to the wafer, and electrical charges are accumulated in the electrostatic capacitances $C_1$ to $C_4$ of the equivalent circuit of FIG. 2, and thus, the potentials of the electrostatic chuck electrodes are shielded on the wafer.

Figure 6C:
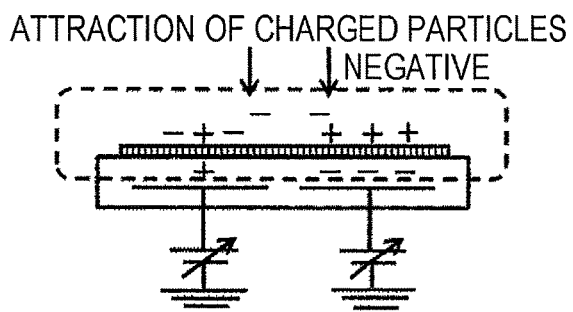
Figure 6D:
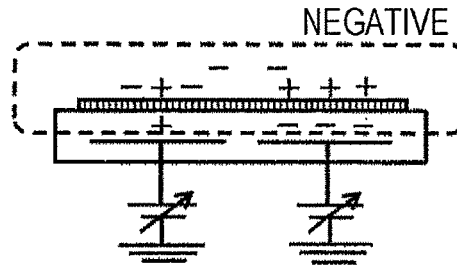
Figure 6E:
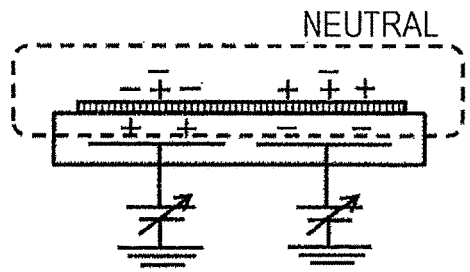

As illustrated in a schematic diagram of FIG. 6C, the charged particles flow from the plasma according to change in the output voltages of the power supplies, and in a system including the electrodes and the whole of the wafer, the influx of the charged particles does not cause the change in potential. Then, at time $t_2$ at which the microwave power is turned off, the potential is generated on the surface of the wafer by the amount of the floating potential of the plasma. As illustrated in a schematic diagram of FIG. 6D, the potential of the whole of the system including the wafer and the electrodes is not changed compared with that immediately before the end of the discharge, even after turning off the microwave power. However, the potential of the whole of the system is cancelled at time $t_b$ after the discharge by shifting the output voltages of the variable DC power supplies in a positive direction, and the potential over the surface of the wafer is changed to 0 V during the time period $T_2$ in which the discharge is interrupted, as illustrated in FIG. 5D.

Figure 7:
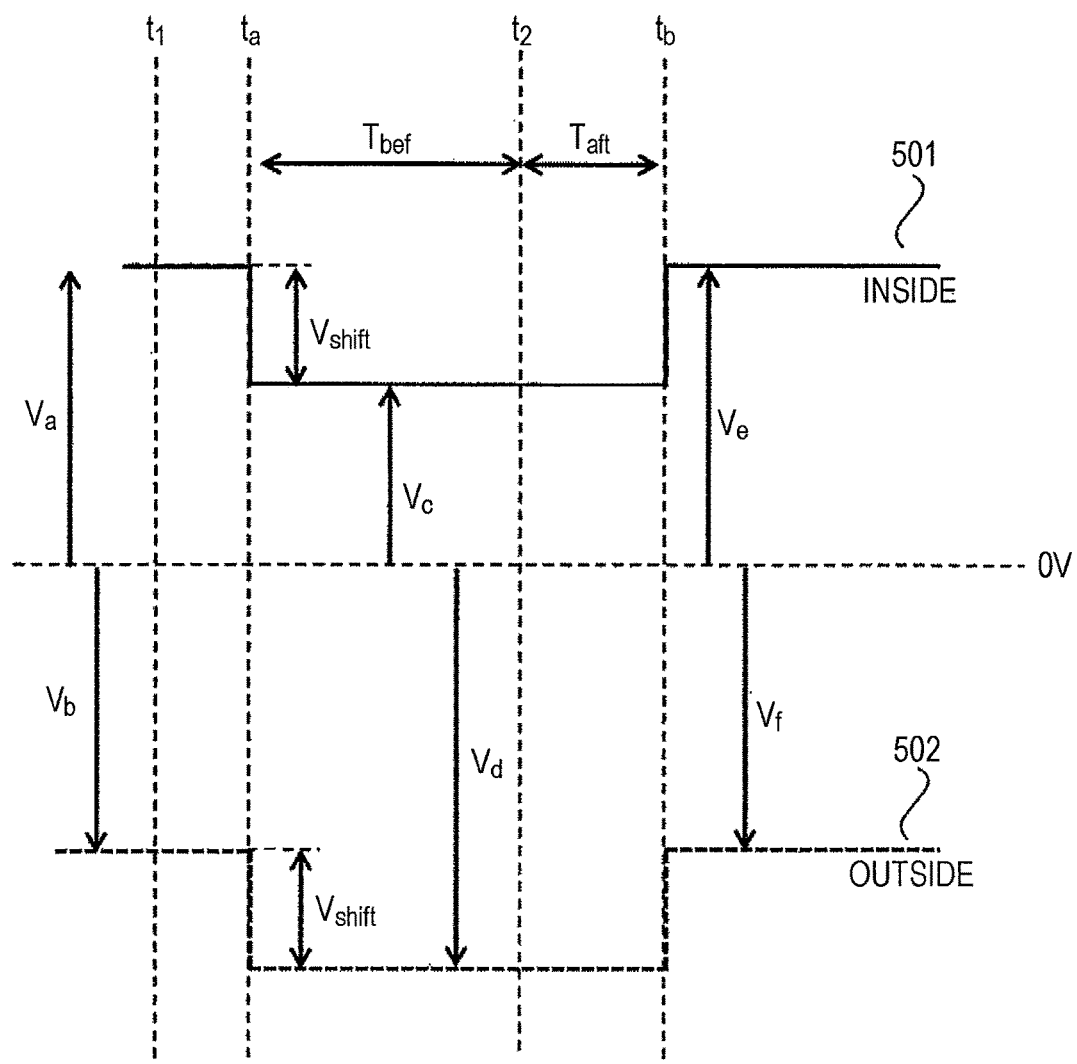
FIG. 7 is a time chart illustrating in detail change in output voltages of variable DC power supplies, around time $t_2$.
Figure 8:
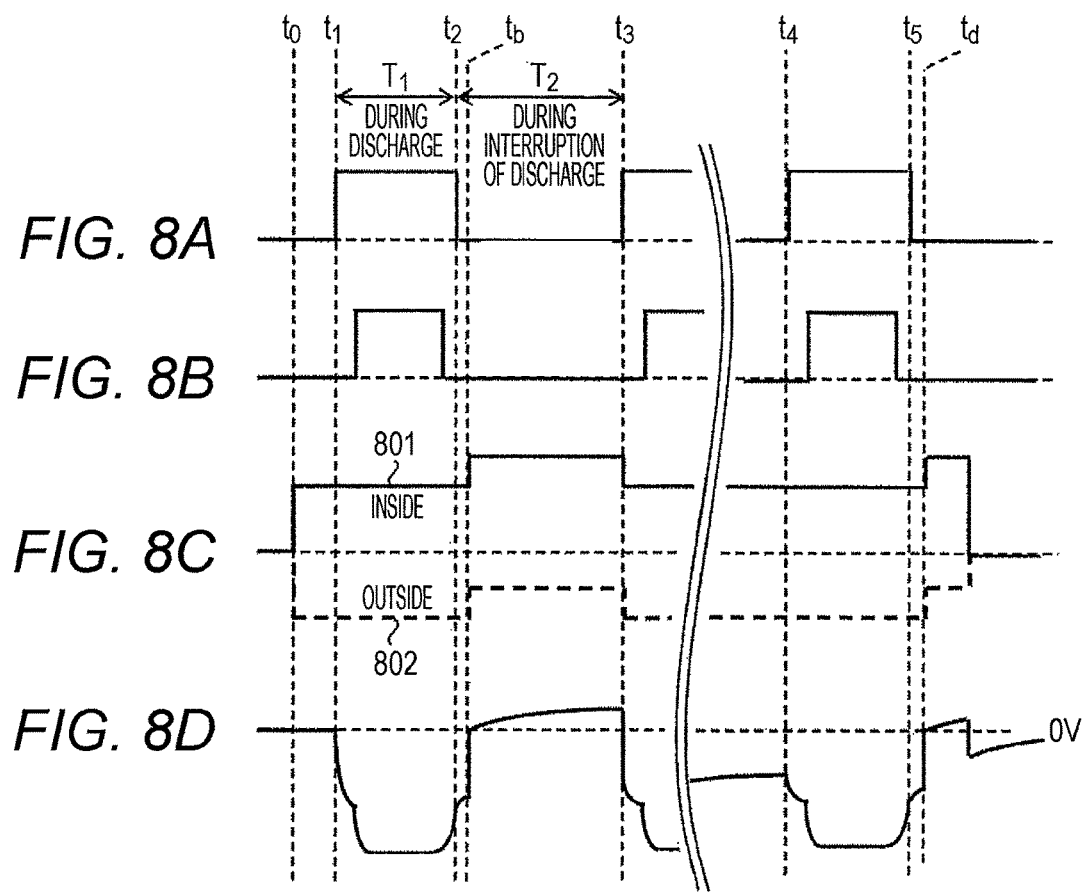
FIGS. 8A to 8D are time charts of processing without shift in a negative direction during discharge.

FIG. 7 is a time chart illustrating in detail the output voltages of the variable DC power supplies, around discharge termination time $t_2$. As described above, the shift of the output voltages of the variable DC power supplies includes two types, that is, shift in the negative direction performed at time $t_a$ during discharge, and shift in the positive direction performed at time $t_b$ after the discharge. In FIG. 7, $T_{bef}$ represents a time from the shift in the negative direction to the end of the discharge, $T_{aft}$ represents a time from the end of the discharge to the shift in the positive direction, and $V_{shift}$ represents a shift amount of the output values of the variable DC power supplies, and these three values need to be determined for control according to an example of the present invention. Note that, in the present example, the end of the discharge corresponds to the turning off of the microwave power. First, for determination of $T_{bef}$, a purpose of the shift in the negative direction at time $t_a$ will be described.

FIGS. 8A to 8D illustrate time charts of processing without the shift in the negative direction during the discharge. FIGS. 8A and 8B are similar to FIGS. 3A and 3B. In FIG. 8C, the output voltages of the variable DC power supplies are shifted at time $t_b$ in the positive direction by an amount of the floating potential to cancel the floating potential generated over the wafer. However, owing to the shift, an average value of the output voltages of both variable DC power supplies is shifted from 0 V to the positive side by a floating potential. Therefore, the potential over the surface of the wafer is changed to 0 V immediately after time $t_b$ as illustrated in FIG. 8D, but according to a time constant of the equivalent circuit illustrated in FIG. 2, potential is gradually generated during interruption of the discharge.

An average value of the output voltages of both variable DC power supplies as a result of the shift in the positive direction needs to be 0 V to prevent the generation of the potential as described above. Thus, the shift in the negative direction is performed during the discharge in which the potential over the surface of the wafer is not shifted even if potentials of the electrostatic chuck electrodes are shifted, and thereby the average value of the output voltages of both variable DC power supplies can be changed to 0 V as a result of the shift in the positive direction.

For this reason, the shift in the negative direction during the discharge is essential, but timing of the shifting may be at any time during the discharge. Accordingly, $T_{bef}$ preferably satisfies a necessary condition of having a time shorter than the discharge time, and is expressed by the following formula 5.

[Math 5]

$$T_{bef} < t_2 - t_1 \qquad \text{formula 5}$$

Next, description will be made of determination of $T_{aft}$ relating to the shifting in the positive direction after the discharge at time $t_b$. At time $t_b$ at which the shift in the positive direction is performed after the discharge, the plasma discharge is required to be fully completed. This is because, as described above, when the plasma is in the processing chamber, the influx of the electrical charges from the plasma prevents the shifting of the potential over the surface of the wafer caused by the shifting of the potentials of the electrostatic chuck electrodes. The plasma in the processing chamber is extinguished by turning off the microwave power, but it is known that plasma called afterglow plasma remains in the processing chamber for a while after turning off the microwave power. Thus, for determination of $T_{aft}$, influence of the afterglow plasma needs to be considered.

Figure 9:
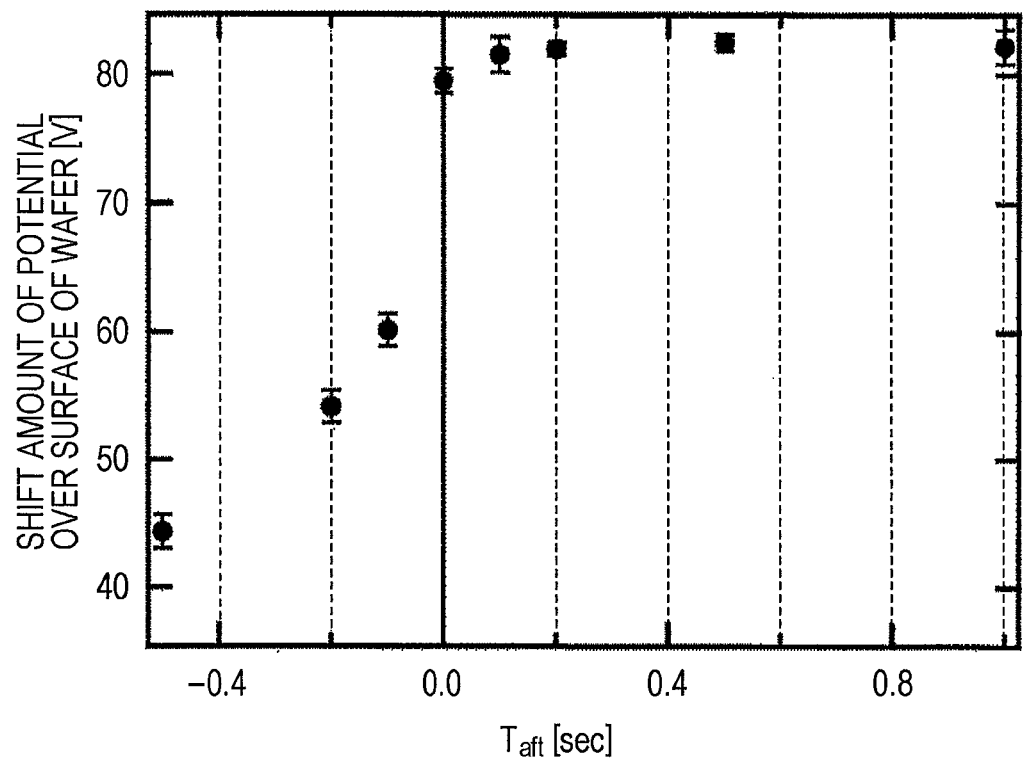
FIG. 9 is a graph illustrating a relationship between a shift amount of potential over a surface of a wafer and $T_{afi}$.

FIG. 9 illustrates a result of an experiment on determination of $T_{aft}$ made by the inventors. FIG. 9 illustrates a relationship between a shift amount of the potential over the surface of the wafer and $T_{aft}$. $T_{aft}$ having a positive value represents that shifting of the output voltages of the variable DC power supplies in the positive direction is started after turning off the microwave power, and $T_{aft}$ having a negative value represents that shifting thereof in the positive direction is started before turning off the microwave power.

When $T_{aft}$ has a negative value, the potential over the surface of the wafer is apparently prevented from being shifted, but the shift amount of the potential over the surface of the wafer where $T_{aft}$ has a positive value of about 0.1 sec, and the shift amount of the potential over the surface of the wafer, where $T_{aft}$ has a positive value of 1 sec are substantially the same. Accordingly, when $T_{aft}$ has a value of not less than 0.1 sec, influence of the afterglow plasma is fully prevented.

Figure 10A:
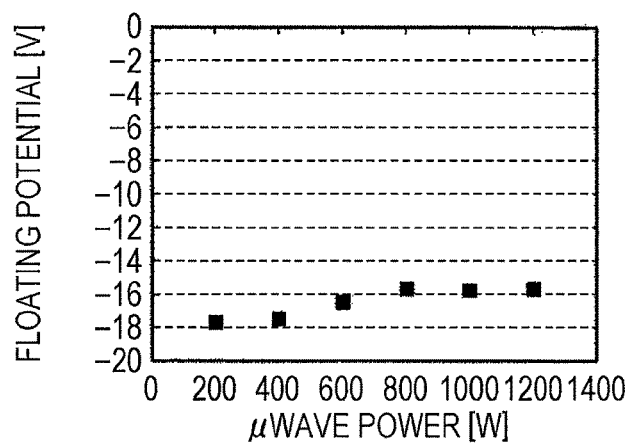
FIGS. 10A to 10C are graphs illustrating dependence of floating potential on microwave incident power, dependence of the floating potential on processing pressure, and dependence of the floating potential on gas species.
Figure 10B:
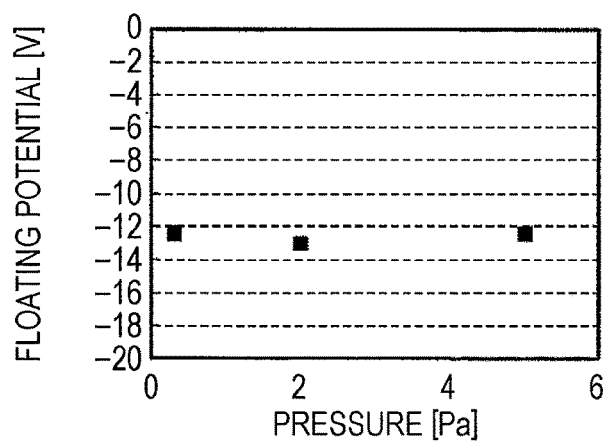
Figure 10C:
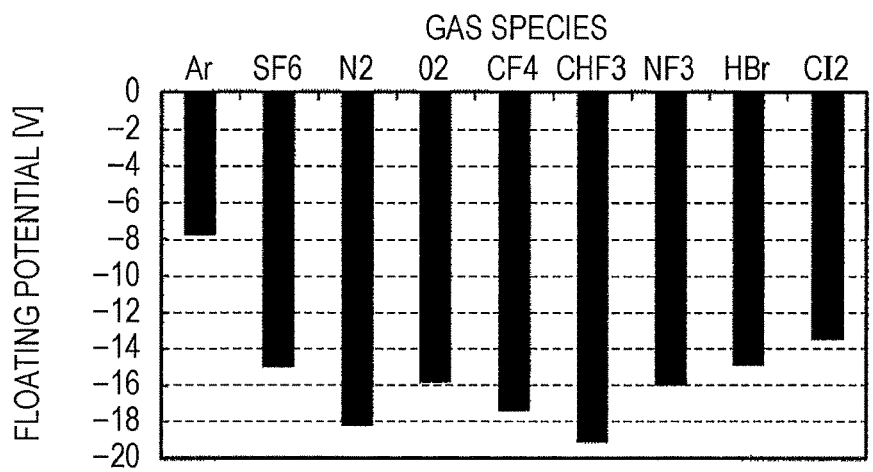

Next, determination of $V_{shift}$ will be described. $V_{shift}$ needs to be shifted by the amount of floating potential of the plasma. FIGS. 10A to 10C illustrate measurement results of the floating potential. FIG. 10A illustrates dependence of the floating potential on microwave incident power, FIG. 10B illustrates dependence of the floating potential on processing pressure, and FIG. 10C illustrates dependence of the floating potential on gas species. The dependence of the floating potential on the microwave power and the pressure is not so large, and the dependence on the gas species is also not so large excepting argon gas. Measurement results show that almost of absolute values of the floating potential are within a range of 12 V to 18 V, and $V_{shift}$ is considered to appropriately have a value of 15V±5V, in consideration of a margin. Further, according to an experiment made by the inventors, a result shows that adhesion of the dust particles onto the wafer is considerably increased when the wafer has a negative potential, but when the wafer has a positive potential, adhesion of the dust particles is substantially the same as that when the wafer has a potential of 0 V. In this condition, $V_{shift}$ is preferably 15V or more.

The values of $T_{bef}$, $T_{aft}$, and $V_{shift}$ obtained as described above are stored in the storage device 115, and are used for control by the control device 116 controlling the output voltages of the variable DC power supplies. Based on $T_{bef}$, $T_{aft}$, and $V_{shift}$ obtained as described above, operation of FIG. 7 will be described. The control device 116 controlling the output voltages of the variable DC power supplies controls both variable DC power supplies to have output voltages $V_a$ and $V_b$ as $V_1$ and $V_2$ in formula 2 at time $t_0$. For example, in FIG. 7, $V_a$ is preferably +500 V, and $V_b$ is preferably −500 V.

At time $t_1$, the control device 116 detects an output starting signal from the microwave power supply 106, and shifts the output voltages of the variable DC power supplies in the negative direction by $V_{shift}$ at arbitrary time $t_a$ satisfying formula 5. For example, when $V_{shift}$ is 15 V as described above, $V_c$ of FIG. 7 is 485 V, and $V_d$ is −515 V. Note that, for determination of $T_{bef}$, time $t_2$ in formula 5 is not fixed at this time, but $T_{bef}$ can be determined from a previously set value of a processing time.

Thereafter, the control device 116 detects an output turn-off signal from the microwave power supply 106 at time $t_2$, and shifts the output voltages of the variable DC power supplies in the positive direction by $V_{shift}$ at time $t_b$ corresponding to $T_{aft}$. For example, in FIG. 7, time $t_b$ is time after 0.1 sec from time $t_2$, $V_e$ is +500 V, and $V_f$ is −500 V.

In the present example, the shift amounts of the output voltages of the variable DC power supplies have the same value between the electrode on the inside and the electrode on the outside. Accordingly, shift in the positive direction time $t_b$ returns the output voltages of the power supplies to the output voltages before the shift in the negative direction is performed at time $t_a$. However, the shift amounts of the electrode on the inside and the electrode on the outside are not limited to the above example.

For example, the electrode on the inside and the electrode on the outside may have shift amounts having different values, respectively. In FIG. 7, when control is performed to have an average value of the output voltages $V_a$ and $V_b$ of the variable DC power supplies on the inside and outside of 0 V, an average value of $V_c$ and $V_d$ of −15 V, and an average value of $V_e$ and $V_f$ of 0 V, the control may be performed to have $V_a$ of +500 V, $V_b$ of −500 V, $V_c$ of +470 V, $V_d$ of −500 V, $V_e$ of +500 V, and $V_f$ of −500 V, in series. However, when the shift is performed to change a difference between the output voltages of both electrodes as described above, the chucking force is likely to be changed, and thus, the chucking force needs to be taken into consideration.

Further, for example, the shift in the negative direction at time $t_a$ and the shift in the positive direction at time $t_b$ may have different values. As described above, the floating potential has variation to some extent. Further, when the wafer has a potential of positive polarity, an increase of the dust particle is not shown compared with the wafer having a potential of 0 V, unlike the negative polarity. Thus, the output voltage values of the variable DC power supplies may be set to slightly shift the potential of the wafer toward the positive polarity at time $t_b$. For example, in FIG. 7, when control is performed to have an average value of the output voltages $V_a$ and $V_b$ of the variable DC power supplies on the inside and outside of 0 V, an average value of $V_c$ and $V_d$ of −15 V, and an average value of $V_e$ and $V_f$ of 5 V, the control may be performed to have $V_a$ of +500 V, $V_b$ of −500 V, $V_c$ of +485 V, $V_d$ of −515 V, $V_e$ of +505 V, and $V_f$ of −495 V, in series. Further, the shift may be performed so that after the average value of the output voltages of the variable DC power supplies on the inside and outside is once shifted from 0 V, and then the average value is returned to its original value. For example, in FIG. 7, when control is performed to have an average value of the output voltages $V_a$ and $V_b$ of the variable DC power supplies on the inside and outside of +5V, an average value of $V_c$ and $V_d$ of −15 V, and an average value of $V_e$ and $V_f$ of 0 V, the control may be performed to have $V_a$ of +505 V, $V_b$ of −495 V, $V_c$ of +485 V, $V_d$ of −515 V, $V_e$ of +500 V, and $V_f$ of −500 V, in series.

Figure 11A:
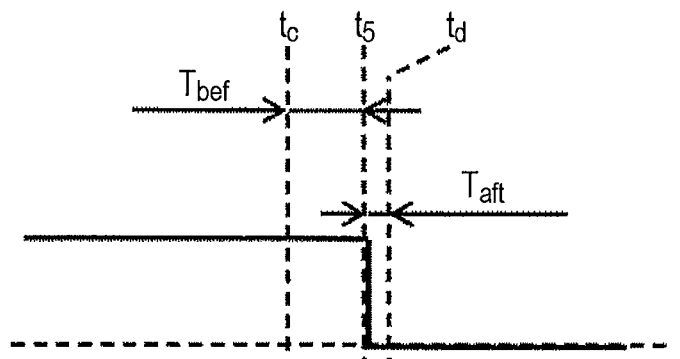
FIGS. 11A to 11D are time charts of chuck termination processing where wafer chucking is finished before turning off microwave power.
Figure 11B:
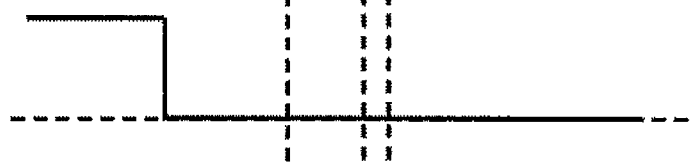
Figure 11C:
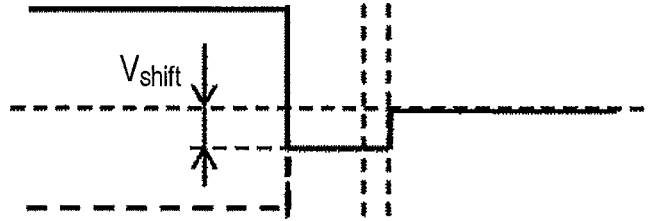
Figure 11D:
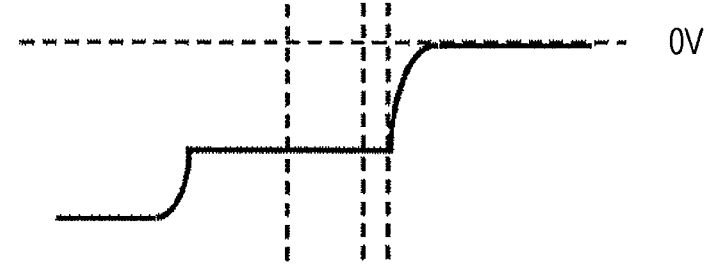

Further, after final discharge, in order to prevent generation of residual adsorption over the wafer, the chucking of the wafer may be finished before turning off of the microwave power. FIGS. 11A to 11D illustrate time charts of processing at the end of wafer chucking described above. In this case, the microwave power is turn off at time $t_5$, but the output voltages of the variable DC power supplies on the inside and outside are set to a negative value shifted by $V_{shift}$ at $t_c$, i.e., $T_{bef}$ before the turning off of the microwave power. After $T_{aft}$ from turning off the microwave power at $t_5$, the output voltages of the variable DC power supplies on the inside and outside are shifted in the positive direction by $V_{shift}$ to be set to 0 V at time $t_d$. As illustrated in FIG. 11D, the above-mentioned chucking termination sequence is used to immediately change the potential over the surface of the wafer to 0 V, after turning off the microwave power, and thus, preventing the attraction of the dust particles to the wafer.

As described above, the control device 116 controls the output voltages of the variable DC power supplies, and the potential over the surface of the wafer generated by the plasma can be cancelled during interruption of the discharge. Note that, in the plasma processing apparatus, the storage device 115 may include a user interface freely setting the output voltage value for the control, based on user's operation.

For example, the plasma processing apparatus may include a display, an input device, and software for displaying a set condition input from the input device on the display, and reading a set value into the storage device, or the storage device 115 may be configured so that the user can freely set the output voltage value therein for the control according to an example of the present invention, using the input device and the display.

Figure 12:
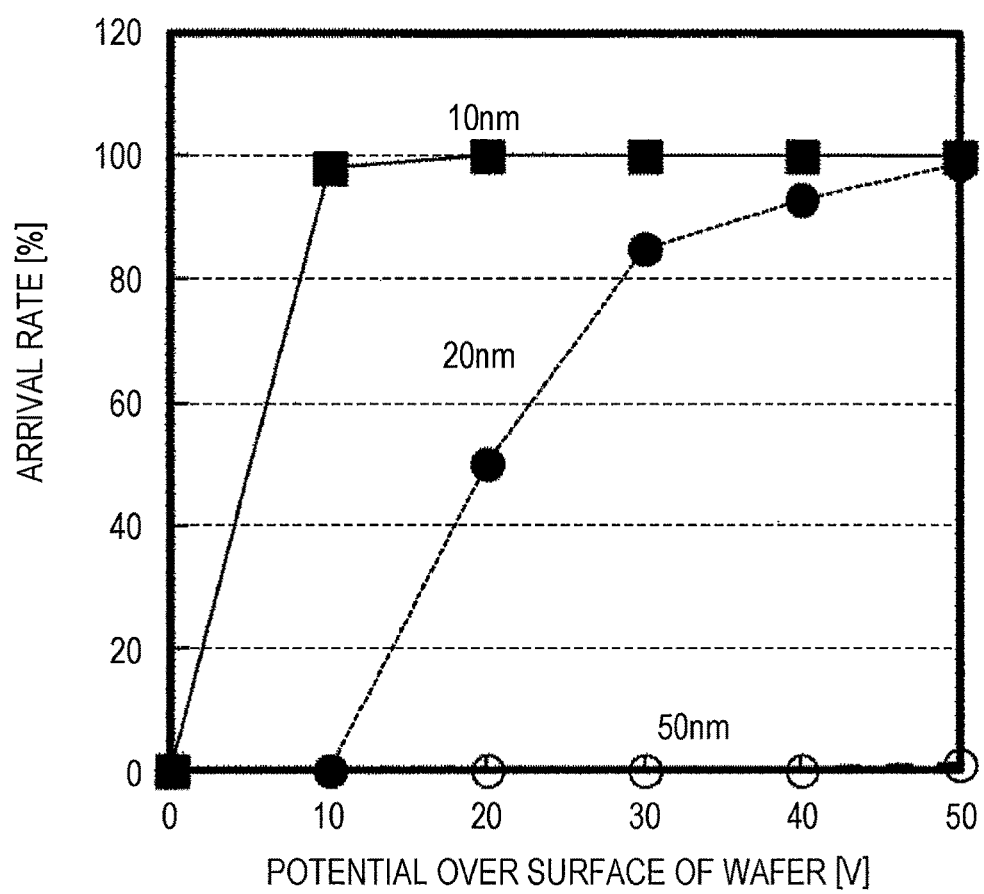
FIG. 12 is a graph illustrating dependence on wafer surface potential in an arrival rate to a wafer, of dust particles.
Figure 13:
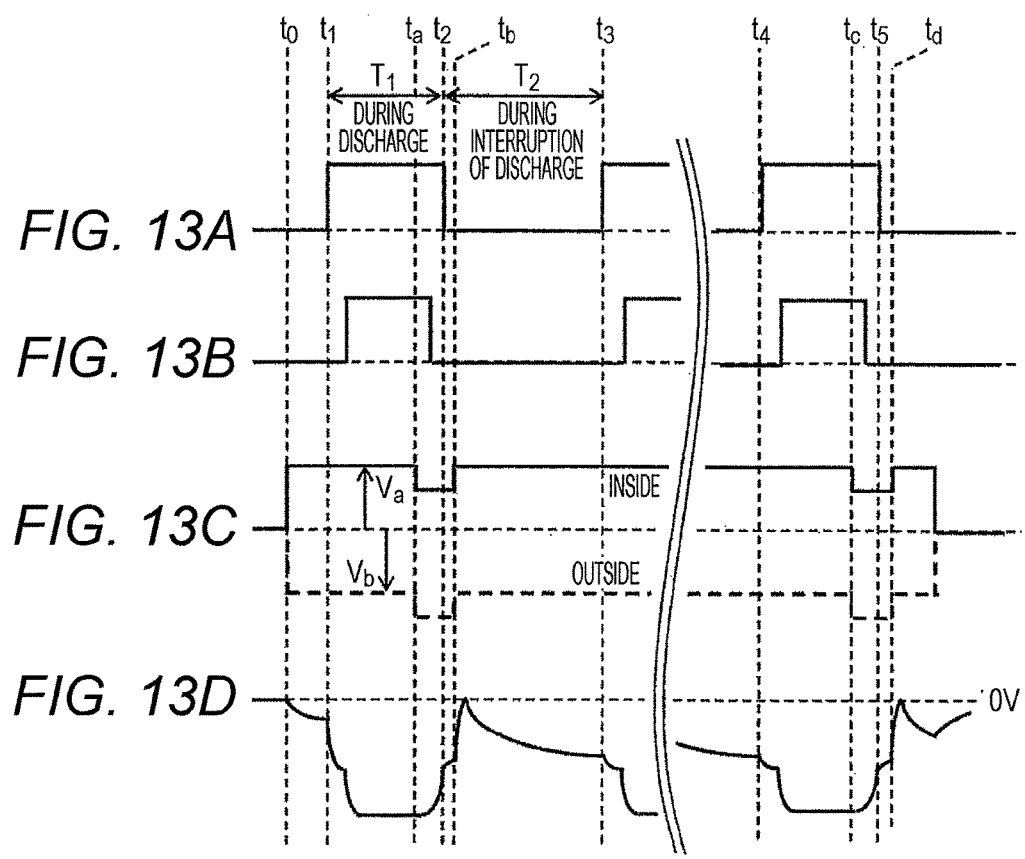
FIGS. 13A to 13D are time charts of processing in which when $R_{in} \neq R_{out}$ and $C_{in} \neq C_{out}$, $V_1 = -V_2$.

Effect of inhibiting adhesion of the dust particles is estimated by calculation, changing the potential over the surface of the wafer to 0 V during interruption of the plasma discharge. The results of the estimation are illustrated in FIG. 12. In FIG. 12, the horizontal axis represents potential over the surface of the wafer, and the vertical axis represents the arrival rate of the dust particles from the inner wall surface of the processing chamber into the processing chamber. The calculation is performed in the following conditions.

The pressure in the processing chamber 101 is 0.6 Pa, and a rarefied fluid flows at an average rate of 3 m/s from an upper part to an outlet in the chamber. Calculation is made for three kinds of particle sizes of the dust particles of 10 nm, 20 nm, and 50 nm. Every dust particle has a charge of $-1.6 \times 10^{-19}$ [C]. The arrival rate is obtained by calculating the behavior of 1,000 particles per calculation, and counting the number of particles arriving at the wafer. The dust particles are generated from a section of the inner wall surface of the vacuum processing chamber which is positioned above the wafer, and places from which the dust particles are generated are determined at random in the section. Further, each dust particle has an initial speed of not more than 5 m/s at random, when the dust particle is generated from the wall surface.

As a result of the calculation made under the above conditions, it was found that large dust particles having a particle size of not less than 50 nm are not increased in arrival rate to the wafer, at a relatively small potential approximate to the floating potential, but small dust particles having a particle size of 20 nm or 10 nm are likely to be attracted to and arrive at the wafer, the wafer having a potential approximate to the floating potential, the dust particle being electrically charged. In particular, almost of the dust particles having a particle size of 10 nm arrives at the wafer at a potential of approximately 10 V, and therefore, according to an example of the present invention, it is considered that the potential over the surface of the wafer generated by the plasma during interruption of the plasma discharge is cancelled, and adhesion of minute dust particles on the wafer can be prevented.

In the present example, an example of the equivalent circuit of FIG. 2 in which $R_{in}=R_{out}$ and $C_{in}=C_{out}$ has been described. When $R_{in}=R_{out}$ and $C_{in}=C_{out}$, the potential of the wafer has the average value of the output voltages of the variable DC power supplies on the inside and outside, therefore, when $V_1=-V_2$, the potential of the wafer is 0 V. In contrast, when the resistance values and capacitance values of the electrostatic chuck electrodes and the wafer have a difference between the inside and outside for any reason, and $R_{in} \neq R_{out}$ in formula 1, or $C_{in} \neq C_{out}$ in formula 3, the potential over the surface of the wafer 103 does not have the average value of the output voltages of the variable DC power supplies on the inside and outside, calculated by formula 1 or formula 3, and even when $V_1=-V_2$, the wafer 103 has potential over the surface.

According to an experiment made by the inventors, the resistance values are considered to have a difference between the inside and outside in the following situations.

For example, when the temperature of the sample stage is controlled differently between the inside and outside, a difference in temperature generates difference in resistance value of the dielectric film over the electrodes between the inside and outside. Further, for example, when the resistance value of the dielectric film over the electrodes or the film on the back surface of the wafer depends on the direction of an electric current flow, the electric current between the electrodes and the wafer flows in the opposite directions between the inside and outside, and thus, the resistance values have a difference between the inside and outside. The capacitance values are considered to have a difference between the inside and outside, when the electrodes have different areas between the inside and outside, or when the dielectric layer is different in thickness between the inside and outside.

When impedances of the wafer and the electrostatic chuck electrodes have a difference between the inside and outside, as described above, potential is inevitably generated on the surface of the wafer by chucking the wafer by the electrostatic chuck electrodes, in addition to influence of the influx of the charged particles from the plasma. The potential generated on the surface of the wafer attracts the dust particles electrically charged onto the wafer, and the adhesion of the dust particles onto the wafer is likely to be increased. In order to prevent adhesion of the dust particles electrically charged onto the wafer, the output voltages of the variable DC power supplies for the electrostatic chuck electrodes need to be determined in consideration of a difference between the inside and outside of the impedances of the wafer and the electrostatic chuck electrodes. An example of $R_{in} \neq R_{out}$ will be described below.

Second Example

In the present example, description will be made of a portion having a configuration different from that of the first example. FIGS. 13A to 13D illustrate time charts of processing in which when $R_{in} \neq R_{out}$, and $V_1 = -V_2$. First, both variable DC power supplies output voltages at time $t_0$ to chuck the wafer on the sample stage, and at that time, the wafer surface potential is shifted to the potential determined by formula 1 for a time according to the time constant of the circuit. At time $t_1$, the microwave is input into the processing chamber to generate the plasma, the charged particles flow into the wafer upon generation of the plasma, and the wafer has a potential the same as the floating potential of the plasma.

Then, shift, in the negative direction, of the output voltages of the variable DC power supplies on the inside and outside at time $t_a$, turning off of the microwave power at time $t_2$, and shift, in the positive direction, of the output voltages of the variable DC power supplies on the inside and outside at time $t_b$ are performed, as described in the first example. The potential over the surface of the wafer is 0 V immediately after time $t_b$, but thereafter, the potential over the surface of the wafer is shifted to the potential determined by formula 1 gradually. As described above, when $R_{in} \neq R_{out}$, and the output voltages of the variable DC power supplies upon chucking are $V_1 = -V_2$, the potential is generated on the surface of the wafer when the plasma discharge is not performed, and the potential may cause attraction of the dust particles onto the wafer.

Figure 14:
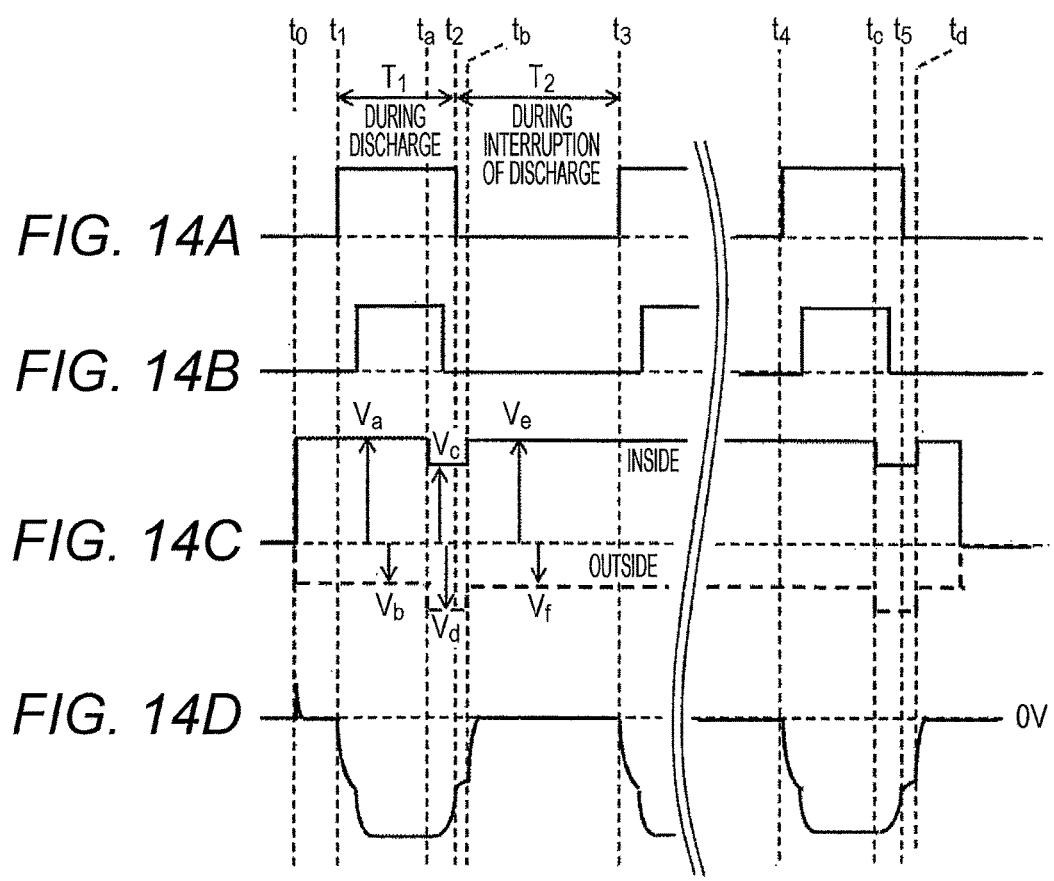
FIGS. 14A to 14D are time charts of processing according to a second example.

FIGS. 14A to 14D illustrate time charts of processing according to the present example. In the present example, the control device 116 controlling the output voltages of the variable DC power supplies controls the variable DC power supplies on the inside and outside to have the output voltages $V_a$ and $V_b$ as $V_1$ and $V_2$ in formula 2, at time $t_0$. For example, in formula 2, when $R_{in} = 6$ M$\Omega$ and $R_{out} = 4$ M$\Omega$, $V_a = +600$ V and $V_b = -400$ V. As described above, when the output voltages of the variable DC power supplies are controlled starting chucking to satisfy formula 2, the wafer surface potential can be reduced before start of the plasma processing, as illustrated in FIG. 14D.

At time $t_1$, the control device 116 detects, from the microwave power supply 106, the output starting signal as the start of the plasma discharge, and then the control device 116 shifts the output voltages of the variable DC power supplies in the negative direction by $V_{shift}$ at arbitrary time $t_a$ satisfying formula 5. For example, in FIG. 14C, when $V_{shift}$ is 15 V, $V_c$ is +585 V, and $V_d$ is −415 V. Thereafter, the control device 116 detects an output turn-off signal from the microwave power supply 106 at time $t_2$, and shifts the output voltages of the variable DC power supplies in the positive direction by $V_{shift}$ at time $t_b$ corresponding to $T_{aft}$. For example, in FIGS. 14A to 14D, time $t_b$ is 0.1 sec after time $t_2$, $V_c$ is +600 V, and $V_f$ is −400 V.

As described above, the chucking performed when $V_1 \neq V_2$ according to formula 2 can inhibit the potential over the surface of the wafer generated by chucking the wafer by the electrostatic chuck electrodes, when $R_{in} \neq R_{out}$. It should be understood that determination of the output voltages of the variable DC power supplies at each time is not limited to the above method, and may be variously changed according to a value of the impedance in the equivalent circuit illustrated in FIG. 2. For example, when the time constant of the circuit is long to extend for several ten seconds, and there is a large difference between $C_{in}$ and $C_{out}$, effect of a difference in capacitance value between the inside and outside may be larger than effect of a difference in resistance value between the inside and outside, between time $t_0$ and time $t_1$. Therefore, In order to cancel the influence of a difference in electrostatic capacitance between the inside and outside, the control device 116 may control the output voltage values of the variable DC power supplies on the inside and outside to satisfy $V_1$ and $V_2$ of formula 4, at time $t_0$, and then perform the control along the time charts illustrated in FIGS. 14A to 14D after time $t_1$.

Further, for example, when the time constant of the circuit is accurately grasped, the control device 116 may control the output voltages of the variable DC power supplies on the inside and outside to satisfy $V_1$ and $V_2$ of formula 4, at time $t_0$, and then gently change the output voltages of the variable DC power supplies on the inside and outside between time $t_0$ to time $t_1$ to inhibit the wafer surface potential from shifting to the potential expressed in formula 3.

In addition to the above configurations, an amount and timing of change in output voltages of the variable DC power supplies can be variously changed without departing from the scope of the present invention. According to the present example, the potential over the surface of the wafer generated by the plasma can be cancelled during interruption of the plasma discharge, and adhesion of the dust particles electrically charged onto the wafer can be reduced.

Next, another embodiment different from the first and second examples will be described below.

Third Example

Figure 15:
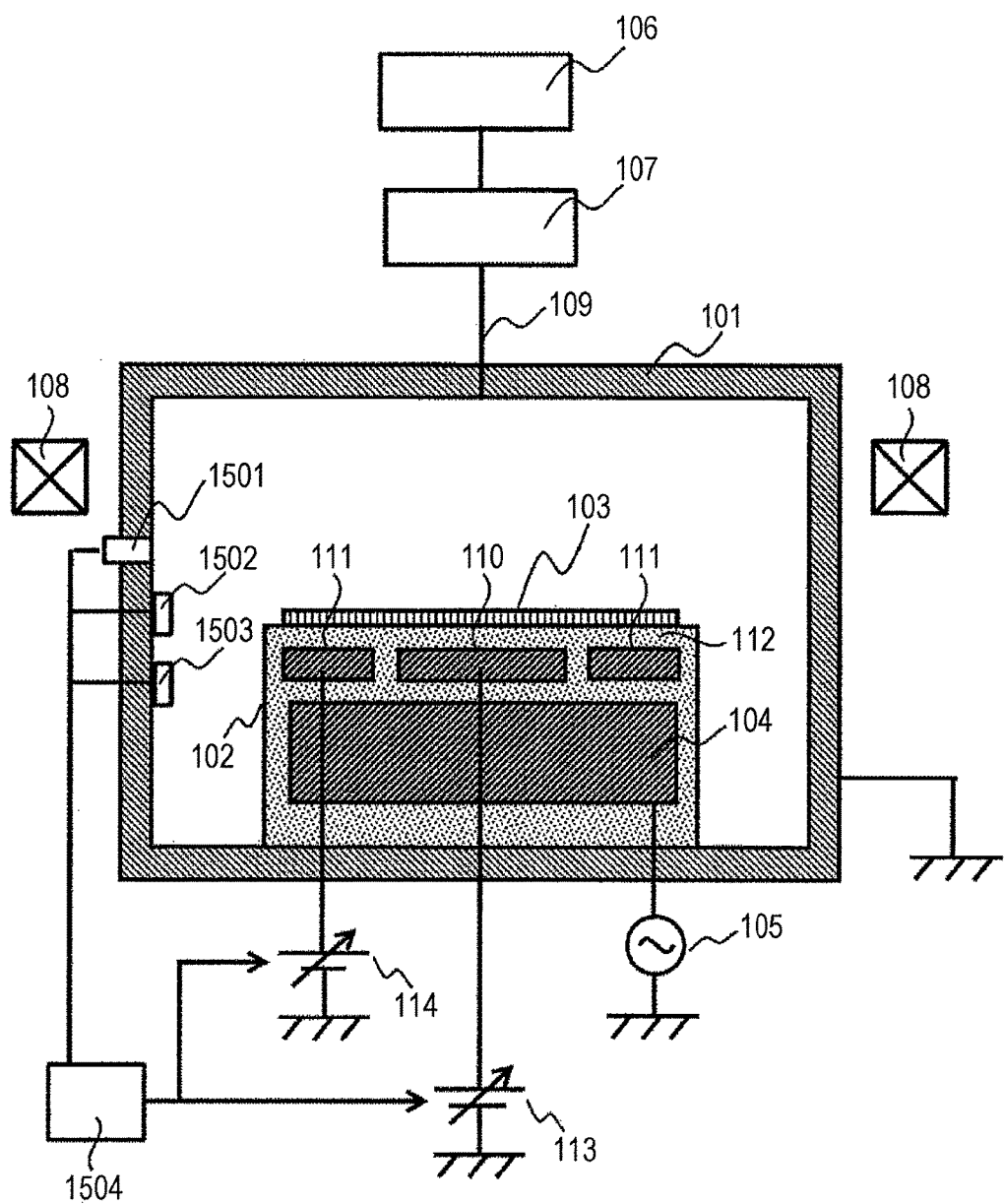
FIG. 15 is a diagram illustrating a cross-sectional configuration of a main portion of a plasma processing apparatus according to a third example.

The plasma processing apparatus according to the present example will be described, using FIG. 15. Further, in the present example, description will be made of a portion having a configuration different from that of the first and second examples. FIG. 15 illustrates a cross-sectional configuration of a main portion of the plasma processing apparatus according to the present example. The plasma processing apparatus of FIG. 15 is also the ECR etching apparatus, but the plasma processing apparatus is not limited to the ECR etching apparatus, and the present example can be also applied to an etching apparatus having another plasma source.

The plasma processing apparatus according to the present example includes a plasma optical emission detecting unit 1501, an ion current measuring unit 1502, a floating potential measuring unit 1503, and a control device 1504 controlling the output voltages of the variable DC power supplies, in addition to components of the first and second examples. The plasma optical emission detecting unit 1501 has, for example, a combination of fibers and a sensor such as a photo multiplier, and can detect optical emission, for detection of generation and extinction (termination) of the plasma.

Further, the ion current measuring unit 1502 has, for example, a combination of an ammeter and a conductor probe to which potential having a negative polarity is fully applied, and can detect a current caused by the influx of the ions from the plasma, for detection of the existence of the charged particles in the vacuum processing chamber. Further, the floating potential measuring unit 1503 has, for example, a combination of a high resistance element and a conductor probe measuring the floating potential of the plasma, and can measure the floating potential of the plasma, for determination of the amount of $V_{shift}$.

The control device 1504 is provided instead of the control device 116, determines time $t_1$ and time $t_2$ based on the generation and extinction of the plasma detected by the optical emission detecting unit 1501 or the ion current measuring unit 1502, and controls the output voltages of the variable DC power supplies, defining the floating potential of the plasma measured by the floating potential measuring unit as $V_{shift}$. The plasma optical emission detecting unit 1501 or the ion current measuring unit 1502 is used to detect the start and termination of the plasma discharge, and the generation and extinction of the plasma is accurately grasped, unlike the control using the microwave output from the power supply.

Therefore, in the present example, $T_{aft}$ may be 0 sec. The time period $T_{aft}$ is a time extending from the termination of the discharge detected by the plasma optical emission detecting unit 1501 or the ion current measuring unit 1502, to the start of the shift, in the positive direction, of the output voltages of the variable DC power supplies. Further, the floating potential measuring unit 1503 is used to determine the value of $V_{shift}$, so that the wafer surface potential can be corrected for a slight change in the floating potential caused by a difference in plasma conditions, and the wafer surface potential can be closer to 0 V accurately during interruption of the discharge. Thus, according to the present example, potential over the surface of the wafer generated by the plasma can be cancelled during interruption of the plasma discharge, and adhesion of the dust particles electrically charged onto the wafer can be reduced.

The present invention has been described in detail based on the embodiments, but the present invention is not limited to the embodiments, and various alterations and modifications can be made without departing from the scope of the invention. For example, a series of devices and a function of performing operations of the devices can be incorporated as software to a main control device (host computer etc.) not illustrated, for controlling the devices as a whole. The series of devices and the function of performing the operations of the devices include monitoring the output values from the microwave power supply 106, and controlling the output voltages of the variable DC power supplies by the control device 116 using the values recorded in the storage device 115.

Further, for example, the series of devices and the function of the devices can be set as one of processing conditions of an existing plasma processing apparatus to be operated as a plasma processing method. The series of devices and the function of performing the operations of the devices include monitoring output values from the microwave power supply 106, and controlling the output voltages of the variable DC power supplies by the control device 116 using values recorded in the storage device 115.

Further, although described in the example of application to the ECR plasma etching apparatus, the present invention can be also applied to a plasma processing apparatus having another plasma source, such as, an inductively coupled plasma etching apparatus or a capacitively coupled plasma etching apparatus.

What is claimed is:

1. A plasma processing method using a plasma processing apparatus including a plasma processing chamber configured to process a sample using plasma, a radio frequency power supply configured to supply radio frequency power for generation of the plasma, a sample stage including an electrode configured to electrostatically chuck the sample, the sample stage configured to mount the sample thereon, and a DC power supply configured to apply DC voltage to the electrode, the plasma processing method comprising:
    shifting the DC voltage previously set, in a negative direction by a predetermined value during discharge of the plasma; and
    shifting the DC voltage having been shifted in the negative direction by the predetermined value, in a positive direction by the predetermined value after the discharge of the plasma.

2. The plasma processing method according to claim 1, wherein
    a shift amount shifting the DC voltage previously set, in the negative direction, has a value changing potential over the sample to 0 V, upon shifting the DC voltage as shifted by the predetermined value in the negative direction, in the positive direction or a value obtained based on a floating potential of the plasma.

3. The plasma processing method according to claim 1, wherein
    the electrode includes:
    a first electrode to which a first DC voltage is applied by the DC power supply; and
    a second electrode to which a second DC voltage having a polarity different from that of the first DC voltage is applied by the DC power supply, and
    a first DC voltage and the second DC voltage are controlled before generation of the plasma, such that the sample has a potential of substantially 0, the potential being generated due to a difference between an impedance between the first electrode and the sample, and an impedance between the second electrode and the sample.

* * * * *